US006328796B1

(12) United States Patent
Kub et al.

(10) Patent No.: US 6,328,796 B1
(45) Date of Patent: Dec. 11, 2001

(54) SINGLE-CRYSTAL MATERIAL ON NON-SINGLE-CRYSTALLINE SUBSTRATE

(75) Inventors: Francis J. Kub, Arnold; Karl D. Hobart, Upper Marlboro, both of MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/243,182

(22) Filed: Feb. 1, 1999

(51) Int. Cl.⁷ .................................................. C30B 25/12
(52) U.S. Cl. ............... 117/94; 117/97; 117/915; 216/2; 216/95; 438/455
(58) Field of Search ............... 117/915, 94, 97; 438/455; 216/2, 95

(56) References Cited

U.S. PATENT DOCUMENTS

| | | | |
|---|---|---|---|
| 5,217,564 | * | 6/1993 | Bolzer et al. ........................ 117/915 |
| 5,391,257 | * | 2/1995 | Sullivan et al. ..................... 117/915 |
| 5,641,381 | * | 6/1997 | Bailey et al. ....................... 117/915 |
| 5,710,057 | * | 1/1998 | Kenney .............................. 117/915 |
| 5,877,070 | * | 3/1999 | Goesele et al. ..................... 117/915 |

FOREIGN PATENT DOCUMENTS 3-270220 * 12/1991 (JP) ..................................... 117/915

* cited by examiner

Primary Examiner—Robert Kunemund
(74) Attorney, Agent, or Firm—John J. Karasek; Jane B. Marciniszyn

(57) ABSTRACT

A method for making a multilayered structure with a single crystal film bonded to a polycrystalline substrate has the steps of:

bonding a single crystal film to a polycrystalline substrate; and growing an epitaxial layer on said single crystal film bonded to said polycrystalline substrate.

37 Claims, 1 Drawing Sheet

SINGLE-CRYSTAL MATERIAL ON NON-SINGLE-CRYSTALLINE SUBSTRATE

BACKGROUND OF THE INVENTION

1. Field of the Invention

The present invention relates generally to methods for the growth of single crystal material layer on a polycrystalline substrate.

2. Description of Related Art

A large area, inexpensive substrate for the growth of epitaxial layers (especially silicon carbide, SiC) has been a long-sought goal. Currently, single crystal 6H- or 4H-polytype SiC substrates are the predominantly used substrates for epitaxial SiC growth. However, single crystal SiC substrates are very expensive and are currently available in small substrates sizes of 2 inch diameter or less.

An alternate approach that has been investigated for SiC epitaxial growth on a large area substrate has been the growth of the cubic polytype of SiC (also referred to as the 3C or beta polytype of SiC) on a silicon substrate. The 3C polytype of SiC is desirable for its high electron mobility and high breakdown field for power electronic device applications, and its isotropic mobility characteristics for sensor applications. However, the large lattice mismatch (~20%) and thermal expansion mismatch (~8%) between SiC and silicon have to date prevented the growth of high quality SiC epitaxial layers on silicon substrates. An additional problem with this approach is that the optimum growth temperature for SiC epitaxial growth is between 1500° C. and 1600° C., well above the 1350° C. maximum use and the 1450° C. melting temperature of a silicon substrate.

Another approach for 3C—SiC growth on silicon substrate has been to first carbonize the silicon surface forming a thin 3C—SiC layer, and then to grow 3C—SiC epitaxial layers on the carbonized silicon surface at a growth temperature below 1350° C. U.S. Pat. No. 4,855,254, issued to Eshita et al. describes a method to carbonize silicon substrate. There is a tendency for anti-phase domains to form in the epitaxial layer for 3C—SiC growth on a (100) orientation silicon substrate. U.S. Pat. No. 5,230,768, issued to Furukawa et al. and U.S. Pat. No. 5,279,701, issued to Shigeta, et. al. describes a method to to obtain improved growth of 3C—SiC material on a silicon substrate silicon substrate that is oriented miscut from (100) orientation. More recent studies have included the growth of 3C—SiC on silicon-on-insulator (SOI) substrates. U.S. Pat. No. 5,759,908, issued to Steckl et al. describes a method to fabricate SiC on SOI substrates.

It is sometimes possible to obtain polytype conversion in growth of SiC depending on the growth temperature, and thus hexagonal polytypes of SiC can sometimes be grown on a cubic polytype of SiC.

It is sometimes possible to obtain polytype conversion in growth of SiC depending on the growth temperature, and thus hexagonal polytypes of SiC can sometimes be grown on a cubic polytype of SiC for high temperature growth.

Wide bandgap gallium nitride (GaN) material has recently been demonstrated to be very beneficial for microwave power transistor applications, and for blue-green laser and light emitting diodes (LED). GaN epitaxial layers have typically been grown on a sapphire substrate or on single crystal SiC substrates. There are continuing searches for new substrates for GaN growth. Sapphire is electrically insulating, a disadvantage for vertical current conducting optical emitters and power devices, and has relatively high thermal impedance which is a disadvantage for high power microwave devices. The best quality GaN epitaxial layers have been obtained for material grown on SiC substrates, however, single crystal SiC substrates are very expensive and are only available in small substrate sizes. GaN epitaxial growth on silicon substrates is recently being investigated as an approach to obtain GaN epitaxial growth on large area substrates. There is however, significant thermal expansion mismatch between GaN and silicon which leads to cracking of the epitaxial layer for thick GaN epitaxial layers. There is also a significant lattice mismatch between GaN lattice and silicon lattice which limits the quality of GaN epitaxial layers grown on a silicon substrate. In addition, the silicon substrate is not suitable for microwave applications because of microwave loss in the conducting silicon substrate.

For GaN growth on a silicon substrate, different polytypes of GaN have a tendency to form, depending on the orientation of silicon substrate. Typically cubic polytypes of GaN will form on a (100) orientation silicon substrate. Likewise, hexagonal polytypes of GaN will form on a (111) orientation silicon substrate. In some cases, a preferred method to grow GaN on silicon is to first form a thin layer of cubic-SiC forms on the silicon surface by carbonization prior to the growth of GaN. There is a relatively good lattice constant match between cubic-GaN and cubic-SiC. Care should be taken in the GaN growth process, to avoid the formation of silicon nitride on the silicon surface prior to the GaN growth.

Non-single crystal ceramic substrates can be designed to have optimized mechanical, thermal expansion, thermal conduction, or electrical conduction properties for particular applications. One polycrystalline ceramic substrate that has especially desirable properties is poly-SiC. Poly-SiC substrates are manufactured commercially in hot pressed sintered form, reaction bonded form, and chemical vapor deposited (CVD) form. The CVD poly-SiC substrates are available commercially in substrate sizes up to 200 mm diameter, with thermal impedance as high as 310 W/mK, electrical resistivity as high as 100,000 ohm-cm at room temperature, electrical impedance as low as 1 ohm-cm, maximum use temperature greater than 2000° C., and excellent thermal expansion matching to single crystal cubic-SiC. Hot pressed sintered poly-SiC substrates are commercially available that have many of the above characteristics, but with electrical impedances as low as 0.1 ohm-cm. Ceramic AlN substrates are available commercially is substrate sizes to 100 mm square, with thermal impedances as high as 170 W/mK, electrical resistivity as high as $10^{-13}$ ohm-cm at room temperature, and excellent thermal expansion matching to single crystal GaN. Polycrystalline diamond has thermal conductivity as high as 1000 W/mK. Ceramic silicon nitride has good thermal expansion matching to silicon. Ceramic graphite substrates are available with electrical impedances as small as 0.001 ohm-cm at room temperature. AlSiC substrates are commercially available, and have good expansion matching to silicon. Mechanical, thermal, optical and electrical data on a large variety of ceramic substrate materials can be found on the National Institute of Standards WWW Version of the Structureal Ceramic web site for ceramics:

http://www.ceramics.nist.gov/srd/scd/scdquery.htm http://www.ceramics.nist.gov/srd/scd/Z00390.htm A provisional patent application filed on Jun. 30, 1998 by Kub and Hobart discussed several techniques to make ultra-thin wafer bonded material layers.

One method of fabricating thin wafer bonded semiconductor layer involves bond-and-etch back (BESOI) technique. The BESOI technique involves bonding a wafer an etch stop layer to an oxidized silicon handle wafer, thinning the wafer that contain the etch stop layer using grinding, chemically etching to the etch stop layer, and then etching the etch stop layer. A key step in the BESOI process is the method of forming the etch stop layer. Heavily doped boron concentration ($>10^{20}$ cm$^{-3}$) layer have been used as the etch stop layer. U.S. Pat. No. 5,540,785, issued to Dennard et al. describes a method to fabricate BESOI that uses a heavily boron doped etch stop layer that has a small percentage of germanium added to heavily boron doped etch stop layer to produce a defect free epitaxial layer. U.S. Pat. No. 5,013,681 issued to Godbey et al. describes a method to fabricate BESOI that uses a strained SiGe etch stop. U.S. Pat. No. 5,024,723 issued to Goesele et al. describes a method to fabricate BESOI by implanting carbon ion into a substrate to form an etch stop layer. The disadvantage of all the BESOI approach is that the entire host substrate must be removed by a laborious sequence of grinding, polishing, and etching. In addition, overall thickness uniformity during the substrate thinning process must be critically maintained since the etch selectivity of Si over SiGe is limited (<100).

U.S. Pat. No. 5,374,564 issued to Bruel describes another method of fabricating a thin wafer bonded semiconductor layer involving combining wafer bonding with a hydrogen implantation and separation technique. The hydrogen implantation and separation technique uses a heavy dose of implanted hydrogen together with subsequent annealing to produce H exfoliation that releases the host substrate to generate the SOI structure. Following exfoliation, the surface has a microroughness of about 8 nm, and must be given a slight chemomechanical polish to produce a prime surface. This step degrades the Si layer thickness uniformity and makes the process unsuitable for producing very thin Si films.

In the past, ultra-thin semiconductor layers have been produced by successive oxidation and oxide etching of silicon-on-insulator (SOI) wafers. In the oxide thinning technique, an SOI substrate with approximately a 200 nm thick silicon layer is thinned to approximately 50 nm by multiple oxidations and dilute hydrofluoric acid etches. This technique is heavily dependent on the thickness uniformity of the SOI silicon layer and the oxidation uniformity. SOI substrates often have a thickness non-uniformity of approximately 10 nm. Thus, the oxidation thinning technique is not suitable for manufacturing ultra-thin (<10 nm) silicon layers.

Ultra-thin semiconductor layers are required for compliant substrates. In the compliant substrate approach, the ultra-thin semiconductor layer will be weakly bonded to a handle substrate and the thin compliant layer will expand or contract as a heteroepitaxially layer is grown on the surface of the ultra-thin semiconductor layer so that defects, if created, will reside in the ultra-thin semiconductor layer. In some cases, a potential mechanism for compliant operation is to bond a thin compliant material layer to a material that become viscous at a high growth temperature. Some examples of materials that become viscous at high temperature include silicon oxide at approximately 900° C., germanium at 950° C., and silicon at 1450° C. In addition, metals, eutectics, and solders have a large range of melting temperatures ranging from 156° C. for indium to greater than 1000° C. for other metals. Glasses and oxides also have a wide range of melting temperatures ranging from below room temperature to greater than 1100 C. for fused quartz. In other cases, the thin compliant material layer can slip at the interface between the thin compliant material and the material layer that it is in contact with. The thin compliant layer will expand or contract during epitaxial layer growth and is susceptible to buckling of the thin compliant layer.

Direct wafer bonding typically requires polishing that the surfaces of the substrates to be bonded to a root mean square (RMS) surface roughness of less than 1 nm. Most materials can be polished to a surface roughness condition of less than 1 nm RMS. However, extensive polishing is required for some materials (e.g., silicon carbide and diamond) to achieve this surface roughness condition. There are a number of approaches that can be used to bond two substrates to reduce the requirement that the two substrate surfaces be polished to an RMS roughness of less than 1 nm. One approach is to deposit a material such as polysilicon, silicon dioxide, silicon nitride, or metal on the substrate surface, and then polish the material to a surface roughness of less than 1 nm RMS. The use of pressure, temperature, or vacuum separately or in combination also reduces the requirement to have a surface polishing of 1 nm or less. If one of the substrates is thin, then the thin substrate will more easily conform to the other substrate during bonding and thus reduce the requirement for surface roughness less than 1 nm RMS.

Metals can be deposited on the substrate surface and the metals will bond to the second substrate surface with the help of pressure, temperature, and vacuum possibly by forming a eutectic with the second substrate material. Metals can be deposited on both substrate surfaces and bonded. Brazing or soft solder materials can be deposited on one or both surfaces and the substrates bonded. Preceramic polymers can be used to bond two substrates. Ceramic materials can be deposited on one or both substrate surfaces, the substrates heated to the melting point of the ceramic material (sometimes under pressure, and the two substrates bonded. Materials such as silicon and germanium that melt during a bonding process and react with the substrate material can be used to bond two SiC substrates together. Electrostatic or anodic bonding can be used to bond a substrate to a alkali containing glass material. In some cases, alkali containing glass can be deposited on one surface by sputtering or evaporation and anodic bonding performed. A rough surface can be coated with a spin-on-glass to achieve a surface smooth enough for bonding. A low melting point frit or solder glass can be deposited on a surface and bonded to a second surface using pressure and temperature. A sodium silicate material deposited on a substrate surface will aid bonding. Bonding approaches that are appropriate for lower temperatures include polymer adhesive, organic adhesive, and epoxy bonding. The ambient is sometimes important during the bonding operation. For bonding of GaAs substrates, it is generally preferred to have a hydrogen ambient during bonding.

SUMMARY OF THE INVENTION

Accordingly, it is an object of this invention to provide an improved method of growth of single crystal material layers on non-single crystalline substrate with the mechanical, thermal expansion, thermal conduction, electrical conduction, and optical transmission properties of the non-single-crystalline substrate selected to optimize the growth of single crystal material layers, and to optimize the performance of devices formed using the grown highly oriented material.

Another object of this invention is to provide wide bandgap material layers such as SiC, GaN, diamond, ZnSe, etc. material layers on optimized large diameter non-single crystalline substrates for a wide number of applications, including lateral conducting microwave power devices, vertical conducting microwave power devices, lateral conducting power switching devices, vertical conducting power switching devices, and vertical and lateral conducting optical laser and LED emitters. This technology can be applied to other materials such as YBCO superconductor and narrow bandgap semiconductor materials.

Another object of this invention is to provide a method to grow single crystal material layers on a wafer bonded thin single crystal material layer on non-single crystalline substrate with the non-single crystalline substrate selected to have thermal expansion, thermal conduction, electrical, and optical properties optimized for the grown single crystal material layer.

Another object of this invention is to provide a method to grow a 3C-polytype SiC single crystal material layer on a thin silicon layer bonded to poly-SiC, ceramic, or non-single crystalline substrate. A carbonization step typically will be performed on the thin silicon layer surface prior to 3C—SiC material growth. The thin silicon layer is can be partially or wholly converted to 3C—SiC by carbonization prior to 3C—SiC epitaxial growth. For the case that the thin silicon layer is not wholly carbonized, it will become viscous for epitaxial growth temperatures near or above the melting temperature of silicon, allowing the thin silicon layer or thin carbonized surface layer to act as a compliant layer for the growth of 3C—SiC epitaxial material. In addition, 3C—SiC can be grown directly on the thin silicon layer without the carbonization step. In some cases, it may desirable that the thin silicon layer have a surface orientation that is miscut from (100) orientation to prevent the formation of anti-phase domains. For a lateral current conducting microwave and power switching device, it is likely desirable to have an insulating non-single crystalline substrate with high thermal conductivity. Also, for lateral current conducting microwave device, power switching device, and piezoelectric resistor device, it may be desirable to have a dielectric insulating layer such as silicon dioxide, silicon nitride, or tantalum oxide between the 3C—SiC layer and the non-single crystalline substrate. For vertical current conducting power devices, it is desirable to have a high electrical conductivity and high thermal conductivity non-crystalline substrate with high electrical conductivity across the bonding interface. A metal or silicon at the bonding interface may be advantageous for electrical current conduction across the interface. Applications include lateral conducting microwave power device, lateral conducting power switching devices, piezoelectric resistor for pressure sensors, vertical conducting microwave power devices, and vertical conducting optical laser and LED emitters. In some cases, it is desirable to deposit and define a masking material (generally silicon oxide material) and to perform lateral epitaxial overgrowth of SiC or GaN material overtop of the masking material.

It is possible to obtain polytype conversion in the growth of SiC depending on the growth temperature and thus hexagonal polytypes of SiC can sometimes be grown on a cubic poly-type of SiC depending on the growth temperature. Thus, another object of this invention is to provide a method to grow a hexagonal-polytype of SiC single crystal material layer on a thin carbonized silicon layer bonded to poly-SiC, ceramic, or non-single crystalline substrate.

An ultra-thin layer of silicon (<10 nm) can be bonded to poly-SiC substrate and then partially or wholly carbonized. The ultra-thin silicon layer can be formed using the techniques of hydrogen (sometimes with the addition of a helium implant to facilitate splitting) ion implant layer splitting plus etch stop, or electrochemical etching plus etch stop as described elsewhere by the inventors. An alternate technique to form the ultra-thin silicon layer bonded to a non-single crystalline substrate is to thin the silicon layer on an SOI substrate to 10 nm, bond the surface of the SOI substrate to the non-single crystalline substrate and etch away the SOI substrate stopping at the silicon dioxide layer. The silicon dioxide layer is next etched to the thin silicon layer.

The ultra-thin silicon layer can then be wholly or partially converted to 3C—SiC using a carbonization process. After the ultra-thin silicon layer is carbonized, a 3C—SiC epitaxial layer, AlN, InGaN, or GaN epitaxial layer can be grown.

Another object of this invention is to provide a method to grow epitaxial layers of cubic-polytype of GaN and hexagonal-polytype of GaN on a thin single crystal layer of silicon or GaAs that is wafer bonded to a poly-SiC substrate, poly-AlN substrate, ceramic substrate, or non-single crystalline substrate. The GaN can be directly grown on the thin single crystal silicon or thin GaAs layer, however, in some cases it is desirable that the surface of the silicon layer be carbonized prior to AlN, InGaN, or GaN epitaxial layer growth. The thin silicon layer is can be partially or wholly converted to 3C—SiC by carbonization prior to GaN growth or AlN buffer growth. Typical, a thin layer of (100) orientation single crystal silicon or GaN layer will be used for cubic-polytype GaN growth, and a thin layer of (111) silicon will be used for hexagonal-polytype GaN growth. An AlN or AlGaN buffer layer is often grown on the substrate surface prior to the GaN or InGaN growth. An interposed layer of a material that becomes viscous at the GaN growth temperature such as germanium, metal, silicon dioxide, or boron-phosphorous doped silicon dioxide between the thin silicon layer and the non-single crystalline substrate can be used so the thin silicon layer expands or contracts during GaN growth to achieve compliant growth of GaN. Applications include lateral conducting microwave power device, piezoelectric resistor for pressure sensors, vertical conducting microwave power devices, and vertical conducting optical laser and LED emitters. For a lateral current conducting microwave and power switching device, it is likely desirable to have an insulating non-single crystalline substrate with high thermal conductivity. Also, for lateral current conducting microwave device, power switching device, and piezoelectric resistor device, it may be desirable to have a dielectric insulating layer such as silicon dioxide, silicon nitride, or tantalum oxide between the GaN layer and the non-single crystalline substrate. For vertical current conducting power devices, it is desirable to have a high electrical conductivity and high thermal conductivity non-crystalline substrate with high electrical conductivity across the bonding interface. A metal or silicide at the bonding interface may be advantageous for electrical current conduction across the interface. Applications include vertical conducting microwave power devices, and vertical conducting optical laser and LED emitters. In some cases, it is desirable to deposit and define a masking material (generally silicon oxide material) on the surface of the carbonized or thin single crystal layer, and to perform layer epitaxial overgrowth of SiC or GaN overtop of the masking material.

Another object of this invention is to provide a method to grow a hexagonal or cubic polytype GaN epitaxial layer on a thin compliant layer that is weakly wafer bonded to a poly-SiC substrate, AlN substrate, ceramic substrate, or non-single crystalline substrate for a wide range of applications, including lateral conducting microwave power devices, vertical conducting microwave power devices, and vertical conducting optical laser and LED emitters.

Another object of this invention is to provide a method to form grooves through the compliant layer at selected lateral separations to allow the compliant layer to expand or contract without buckling during the growth of single crystal material layers.

Another object of this invention is to provide a method to fabricate a material structure where there is an additional material layer between the thin single crystal material layer and the non-signal-crystalline substrate with the further growth of a wide bandgap material layer on the surface of the material structure. The additional material layer may be a dielectric layer to provide insulation, a low melting point material to allow viscous flow for a compliant substrate, or a silicide or metal to aid bonding and vertical electrical current conduction. In some cases, it is difficult to polish the non-single crystalline substrate to a surface roughness sufficiently small for direct wafer bonding. An alternative is to deposit a material layer such as polysilicon, silicon oxide, silicon nitride, glasses, or metal on the non-single crystalline surface and polish the deposited material to a surface roughness suitable for direct wafer bonding.

These and additional objects of the invention are accomplished by the structures and processes hereinafter described.

The invention uses the wafer bonding technique to bond a thin single crystal material to a non-single crystalline substrate with the non-single crystalline substrate selected to have certain mechanical, thermal expansion, thermal conduction, and electrical conduction characteristics, and the further growth of a single crystal material on a thin wafer bonded material layer.

An aspect of the present invention is a method for growing a single crystal material layer on a thin single crystal layer that is bonded to a non-crystalline substrate, having the steps: (a) using techniques that include wafer bonding and other known techniques to form a thin single crystal material layer or plurality of layers on a non-crystalline substrate (in some cases, an additional material layer or layers can be interposed between the non-crystalline substrate and the thin single crystal material layer), (b) optionally growing a carbonization or buffer layer on the thin bonded single crystal layer, and (c) growing a single crystal material layer or plurality of layers (including possibly lateral epitaxial overgrowth material) on the thin single crystal layer.

Another aspect of the present invention is a method for growing a thin single crystal material layer on a first substrate, transferring the thin single crystal layer to a non-crystalline substrate, having the steps: (a) growing a single crystal material layer on a first substrate, (b) implanting hydrogen (and/or helium) to a selected depth into the first substrate; (c) bonding the thin single crystal layer to a non-single crystalline substrate; and cause the first substrate to split at the selected depth. d) etching the remaining first substrate material to the single crystal substrate (g) growing a single crystal material layer or plurality of layers (including LEO) on the thin bonded layer.

Another aspect of the invention is a method for making a compliant ultra-thin single crystal layer compliantly bonded to a substrate. One way of doing this is to interpose a viscous layer between a single crystal layer and a polycrystalline substrate. Alternately, the thin single crystal layer (or single crystal layer with a buffer layer on its surface) can become viscous at the growth temperature.

Another aspect of the invention is a method for making a single crystal layer bonded to a non-single crystalline substrate with high thermal conductivity, having the steps: (a) growing a material layer that includes an etch stop layer on a first substrate; (b); implanting hydrogen (and/or helium) to a selected depth into the first substrate; (c) wafer bond the first substrate to the second substrate; (d) cause the first substrate to split at the selected depth; and (e) etching the remaining portion of first substrate to the etch stop layer.

Another aspect of the invention is a method for making a single crystal layer bonded to a non-single crystaline substrate with high thermal conductivity: (a) implanting hydrogen (and/or helium) to a selected depth into the first substrate (or into a material layer grown on the first substrate); (b) wafer bond the first substrate to a second non-single crystalline substrate; (c) cause the first substrate (or the material layer on the first substrate) to split at the selected depth, and (d) polish the surface of the substrate to small surface roughness.

BRIEF DESCRIPTION OF THE DRAWINGS

A more complete appreciation of the invention will be obtained readily by reference to the following Description of the Preferred Embodiments and the accompanying drawings in which like numerals in different figures represent the same structures or elements, wherein.

DETAILED DESCRIPTION OF THE PREFERRED EMBODIMENTS

Figure 1:
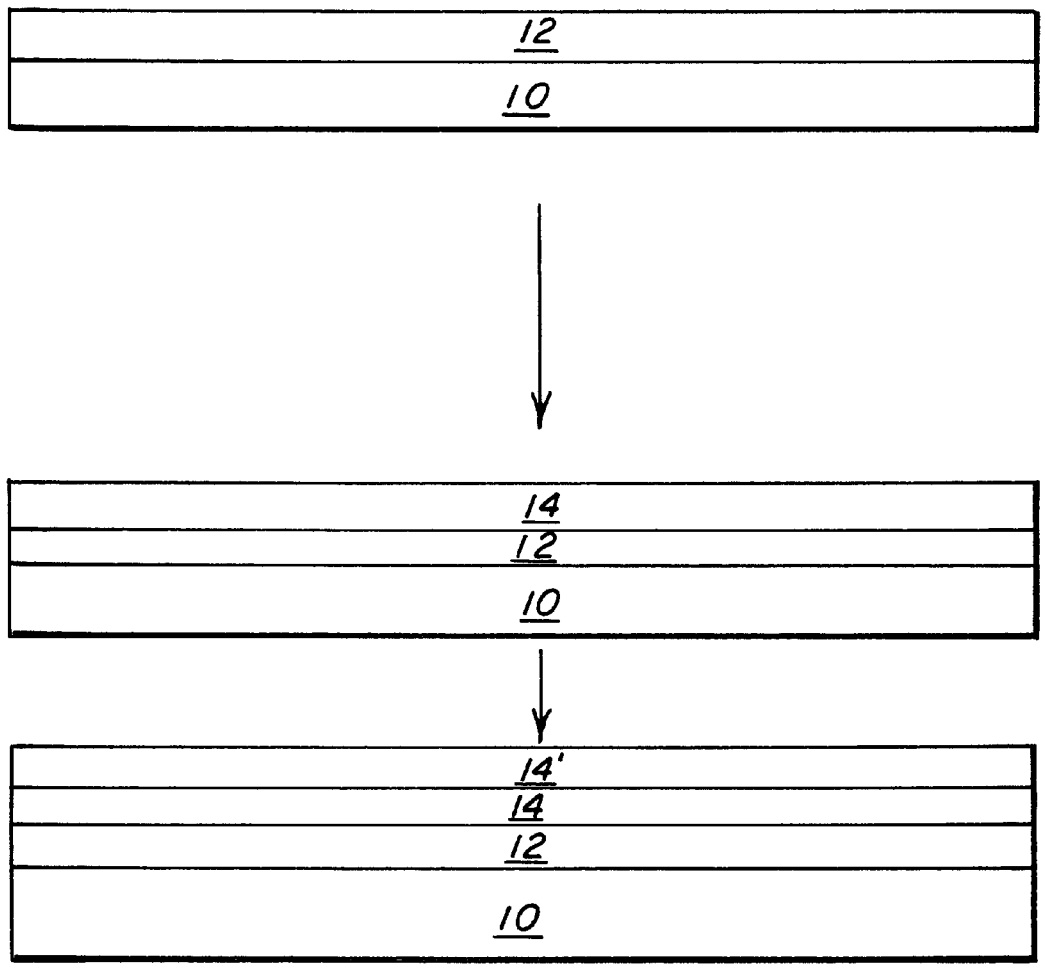
FIG. 1 illustrates a method according to the invention.

Referring to FIG. 1, a method according to the invention has a polycrystalline substrate 10 with a thin single crystal film 12 bonded to it. Preferably, bonding is by direct wafer bonding, but other methods may be used as well. This single crystal thin film 12 provides a good surface for the subsequent epitaxial growth of one or more epitaxial layer 14, 14'.

In this invention, several concepts are combined to produce substrates that are ideally suited for the growth of high quality 3C—SiC and other epitaxial materials. To overcome the thermal expansion mismatch problem of 3C—SiC epitaxial growth on silicon, polycrystalline 3C—SiC wafers have been used as mechanical substrates. The poly 3C—SiC substrates, produced by chemical vapor deposition (CVD) and subsequent machining into wafers, are widely used in the microelectronics industry for wafer blanks and wafer carriers, and thus must be highly pure. The material is thermally expansion matched to 3C—SiC. The poly 3C—SiC is also thermally stable permitting high temperature (<2600° C.) epitaxy and more optimal growth conditions of epitaxial 3C—SiC films. In order to produce monocrystalline 3C—SiC films on the polycrystalline substrates, an ultra-thin Si film is transferred to the poly 3C—SiC substrate by a novel wafer bonding process. The ultra-thin Si seed layer is partially or wholly carbonized to form the buffer layer for subsequent 3C—SiC epitaxy. The direct bonding of the ultra-thin (<20 nm) single crystal films to poly 3C—SiC prevents void formation during the carbonization process as well as the formation of oxygen precipitates in the 3C—SiC film observed during growth on SOI substrates. It is shown here that the substrate fabrication process is highly scalable (poly 3C—SiC wafers are available up to 8") and initial results of carbonization and 3C—SiC epitaxy demonstrate that the hybrid substrate concept significantly improves film quality.

An approach is described below to produce a thin 3C—SiC single crystal semiconductor layer on poly-SiC handle substrate. A 3C—SiC epitaxial layer or AlN, AlGaN, InGaN, GaN epitaxial layer can be grown on this surface.

Also, the lateral epitaxial overgrowth (LEO) material growth process can be used to produce high quality SiC or GaN material on this surface. A major advantage of this approach is that the thermal expansion coefficient of the poly-SiC closely matches the thermal expansion coefficient for 3C—SiC epitaxial layer, the poly-SiC can withstand a high processing temperature, the poly-SiC substrate has a high thermal conductivity, and the poly-SiC substrate can be insulating which is beneficial for microwave circuits, or the poly-SiC substrate can be highly conductive which is beneficial for power switching devices or microwave devices in which there is vertical electrical conduction.

Handle Substrate B preparation

1. Polish a poly-SiC handle substrate so that the surface roughness is less than 10 nm.

Preparation of an ultra-thin 3C—SiC single crystal semiconductor layer on Substrate A 2. Ultra-thin (2 nm to 50 nm thick) 3C—SiC layers can be formed on the silicon <100> orientation or <111> orientation surface (or off-orientation <100> or <111> surface) of Substrate A through carbonization. The 3C—SiC surface will later be direct bonded to the poly-SiC handle Substrate B, and the silicon substrate etched away using the 3C—SiC layer as the etch stop layer.

3. An optional step is to grow 3C—SiC epitaxial layer on the carbonized 3C—SiC surface. As mentioned above, a thin 3C—SiC layer can be grown on a silicon surface using a process called carbonization. If this layer is too thin to act as an etch stop, a thicker 3C—SiC layer can be formed by the epitaxial growth at this step. In order to direct bond, it is necessary that the surface roughness be <10 nm. An additional polish step can be used if the surface roughness is not <10 nm.

4. An optional step is to deposit a thin material layer (silicon dioxide, polysilicon, or silicon nitride) on the prebond Substrate B or Substrate A prior to bonding. A possible reason to use this material layer is that it is generally easier to polish an insulator to a surface roughness <1 nm then it is to polish a hard material such as poly-SiC. Another reason an insulator may be desirable is for the case that a weak bond at the interface of an insulator-compliant layer or a viscous layer at the growth temperature can be used so that the compliant layer can expand or contract during epitaxial growth.

5. Direct bond the 3C—SiC surface of Substrate A to poly-SiC handle Substrate B.

The surfaces of Substrate A and Substrate B can be prepared so that either hydrophillic or hydrophobic direct bonding can be performed.

6. Anneal the bonded wafer pair at 500° C. to 1100° C. to increase the bond strength.

7. Etch away the silicon portion of Substrate A and stop at the 3C—SiC layer. The most conventional way to remove the silicon portion of Substrate A would be to grind the silicon so that there is a remaining silicon thickness of approximately 10 µm. Chemical etching is then used to etch the remaining silicon and stop at the 3C—SiC layer.

Alternate techniques to the grinding and etching approach for removing the silicon portion of Substrate A are the hydrogen layer splitting plus etch stop technique or the electrochemical etching plus etch stop technique (if the poly-SiC substrate is conductive).

8. Epitaxial layers of 3C—SiC, GaN, InGaN, or AlGaN can now be grown on the 3C—SiC surface. A particular advantage is obtained for the case that 3C—SiC epitaxial layer is grown on a 3C—SiC poly handle Substrate B is used. In this case, there is an excellent match of the thermal coefficient of expansion between the 3C—SiC epitaxial material and the 3C-polysilicon handle substrate which allows a thick epitaxial layer to be grown without cracking of the epitaxial layer.

As noted above, the invention uses wafer bonding to form a thin, single crystal material layer on a non-single crystalline substrate and subsequent growth of single crystal material layer on the thin bonded single crystal material layer. Techniques that use hydrogen (and/or helium) ion implant layer splitting, etching to etch stop or polishing, along with wafer bonding can be used to form the thin single crystal wafer bonded layer. In addition, normal grinding and etch stop techniques can be used to produce thin single crystal layers.

One of the key advantages for the use of the poly-SiC substrate approach described above is that it is one of the most viable approaches for making large diameter, relatively low cost wide bandgap semiconductor substrates. Large diameter poly-SiC substrates are readily available at relatively low cost, especially compared to the high cost of 2" diameter single crystal SiC substrates. Other advantages of poly-SiC are its high thermal conductivity (ca. 250 W/mK), an important feature for high power microwave and high power switching devices.

The electrical conductivity of poly-SiC can be controlled, and optimized for various applications. Highly insulating poly-SiC is typically desired for microwave devices in order to achieve low loss transmission lines and passive devices. For power switching devices with vertical conduction, highly conductive poly-SiC substrates are desired.

Additional Embodiments

A. Carbonization

An ultra-thin (<10 nm) layer of Si can be bonded to a poly-SiC substrate, and then partially or wholly carbonized. The ultra-thin layer can be formed using the hydrogen (and/or helium) ion implant splitting plus etch stop technique, or using the hydrogen (and/or helium) ion implant splitting plus chem-mechanical polish plus oxidation thinning, or by electrochemical etching plus etch stop technique, or by thinning the Si layer of an SOI substrate to 10 nm, bond the Si to poly-SiC, and etch away the SOI substrate down to the silicon dioxide layer.

The ultra-thin Si layer can then be wholly or partially converted to 3C—SiC using a carbonization process. After the ultra-thin Si layer is carbonized, a 3C—SiC epitaxial layer, AlN layer, InGaN, or GaN epitaxial layer can be grown.

B. Alternate Substrates

A similar approach can be used for a polycrystalline or ceramic substrate that has the same thermal coefficient of expansion as a GaN epitaxial layer. It may be desirable to bond the thin 3C—SiC layer or a thin GaN layer to a polycrystalline AlN handle substrate, and remove the substrate as described above. There is a good thermal coefficient match between AlN and GaN. Thus, thick layers of GaN can be grown on the thin single-crystal layer on poly-AlN substrate. The thin GaN layer can be made by growing GaN or AlN on silicon, hydrogen (and/or helium) implanting into the silicon layer for layer splitting, and direct bonding the GaN or AlN to the poly-AlN substrate. Alternate substrates include other ceramic substrates glass and quartz substrates.

C. Thin Insulator Layers Between the Polycrystalline Substrate and an Ultra-thin Compliant Layer An optional step is to deposit a thin insulator (e.g., silicon dioxide or nitride) on the prebond Substrate B or Substrate A prior to bonding as discussed in Step 4 above. One reason to use this insulator layer is that it is generally easier to polish an insulator to an RMS roughness <1 nm than is is to polish hard materials such as poly-SiC. Furthermore, a weak bond at the interface of an insulator-compliant layer can be used so that the compliant layer can expand or contract during epitaxial growth.

D. Thin GaN Layer Direct Bonded to Polycrystalline or Single Crystal Si Substrate Conventional GaN epitaxial growth suffers from the use of unsatisfactory sapphire substrates. Sapphire has poor thermal conductivity, and is highly insulating.

A method for making a thin GaN layer on a polycrystalline or single crystal substrate that uses hydrogen implant layer splitting and direct bonding is to:

1. Grow a GaN layer (ca. 1.5 $\mu$m thick) on sapphire substrate A. The GaN must have a surface roughness <1 nm. Polish the GaN if necessary.

2. An optional step is to deposit a thin layer of oxide, GaAs, or Si on the GaN surface. This layer can be polished sufficiently to permit direct bonding.

3. Implant hydrogen into GaN on the sapphire substrate with a dose of ca. >$5 \times 10^6$ cm$^{-2}$ and an energy of 90 KeV (depth of ca. 800 nm into Si).

4. Prepare the surfaces of Substrate A and Substrate B (the handle substrate) for direct bonding. The typical surface preparation includes chemical cleaning such as RCA1, phirana, and UV ozone to remove organics on the surface, followed by a chemical step to make the surface either hydrophobic or hydrophilic. For low temperatures (<500° C.), the hydrophilic surface preparation provides stronger bond energy than hydrophobic, and is preferred when hydrogen layer splitting is employed and for compliant substrates when epitaxial growth temperatures are greater than ca. 450° C.

5. Direct wafer bond Substrate A to Substrate B. Substrate B can be, e.g., polycrystalline, or a silicon substrate that has a hydrogen terminated surface, a thin native oxide surface, or a thick insulator on the surface. Similarly, Substrate A may also have a hydrogen terminated surface, a thin native oxide surface, or a thick insulator on the surface. A low temperature anneal (ca. 250° C.) to increase the bond strength prior to hydrogen layer splitting may be desirable.

6. Heat the bonded wafer pair to about 500° C. to cause the hydrogen gas to expand and split off the GaN and sapphire at the location of the peak hydrogen implant dose. Alternately, a high pressure nitrogen gas stream can be directed at the side of the wafer where to cause the wafer to split at the location of the peak of the hydrogen and/or helium ion implant. There may be other techniques such as etching damaged regions that will cause the substrate to split at the location peak of the ion implant damage.

7. An optional step is to polish the surface of the GaN at the location of the hydrogen layer splitting.

8. Grow an additional GaN on the GaN layer/Substrate B.

The approach described above can be applied to any material system in which an epitaxial layer is first grown on an non-optimum substrate, and there is a desire to transfer the material to a more optimum substrate for thermal conduction, thermal expansion, electrical or optical properties.

Obviously, many modifications and variations of the present invention are possible in light of the above teachings. It is therefore to be understood that, within the scope of the appended claims, the invention may be practiced otherwise than as specifically described.

What is claimed is:

1. A method for making a multilayered device with an epitaxial layer grown on a single-crystal film bonded to a non-single crystalline substrate, comprising the steps of:
   a. wafer bonding a single-crystal film, consisting of one or more single-crystal layers, to a non-single crystalline substrate, wherein said substrate has a thermal coefficient of expansion; and
   b. growing a first epitaxial layer on said single-crystal film, wherein said first epitaxial layer has a thermal coefficient of expansion, and wherein said thermal coefficient of expansion for said substrate and said epitaxial layer are closely matched.

2. The method of claim 1, wherein said polycrystalline substrate is a ceramic substrate.

3. The method of claim 1, wherein said single crystal film is a compliant single crystal film.

4. The method of claim 1, wherein said single crystal film is a semiconductor.

5. The method of claim 1, wherein said single crystal film is selected from the group consisting of MgO, Si, SiC, InP, GaSb, GaAs, and $CaF_2$.

6. The method of claim 1, wherein said substrate is electrically insulating.

7. The method of claim 1, wherein said substrate is electrically conducting.

8. The method of claim 1, wherein said substrate has a high thermal conductivity.

9. The method of claim 1, wherein said substrate is optically transparent.

10. The method of claim 1, wherein said substrate is selected from the group consisting of SiC, graphite, diamond, and AlN.

11. The method of claim 1, wherein said epitaxial layer is selected from the group consisting of SiC, AlN, GaN, InGaN, diamond, and AlGaN.

12. The method of claim 1, further comprising:
   growing at least one additional epitaxial layer on said epitaxial layer on said single crystal film bonded to said polycrystalline substrate.

13. A method for making a multilayered device, comprising the steps of:
   a. growing a single-crystal etch stop layer, consisting of one or more single-crystal layers, on an etchable first substrate;
   b. wafer bonding said single-crystal etch stop layer to a second non-single crystalline substrate having a thermal coefficient of expansion;
   c. etching said etchable first substrate to expose said single-crystal etch stop layer; and
   d. growing an epitaxial layer having a thermal coefficient of expansion on said single-crystal etch stop layer and wherein said second non-single crystalline substrate and said epitaxial layer have closely matched coefficients of thermal expansion.

14. The method of claim 13, wherein said epitaxial layer is selected from the group consisting of SiC, AlN, GaN, InGaN, diamond, and AlGaN.

15. The method of claim 12, further comprising:
   prior to said step of bonding said single crystal etch stop layer to a polycrystalline second substrate, implanting hydrogen into said first substrate to a selected depth below said single crystal etch stop layer; and
   after said step of bonding said single crystal etch stop layer to a polycrystalline second substrate, heating said first substrate, to split said first substrate at the preselected depth of said implanted hydrogen.

16. The method of claim 12, wherein said single crystal etch stop layer is selected from the group consisting of Si, GaAs, CaF$_2$.

17. The method of claim 12, wherein said etchable first substrate is a ceramic substrate.

18. The method of claim 12, wherein said etchable first substrate is selected from the group consisting of SiC and GaN.

19. The method of claim 12, wherein said single crystal film is a compliant single crystal film.

20. The method of claim 12, wherein said substrate is electrically insulating.

21. The method of claim 12, wherein said substrate is electrically conducting.

22. The method of claim 12, wherein said substrate has a high thermal conductivity.

23. A method of making a multilayered device, comprising the steps of:
   a. wafer bonding a single-crystal film to a non-single crystalline substrate, wherein said non-single crystalline substrate has a thermal conductivity greater than 1.5 W/mK at room temperature; and
   b. fabricating said device at a temperature greater than 300° C.

24. The method of claim 22, wherein said thermal conductivity is greater than 10 W/mK at room temperature.

25. The method of claim 22, wherein said substrate is an amorphous substrate.

26. The method of claim 22, wherein said substrate has a strain point temperature greater than 1140° C.

27. The method of claim 2, wherein said polycrystalline substrate is silicon carbide.

28. The method of claim 2, wherein said ceramic substrate is aluminum nitride.

29. The method of claim 1, further including a bond interface between said substrate and said single-crystal film and wherein said bond interface is electrically conducting.

30. The method of claim 11, wherein said first epitaxial layer is GaN.

31. The product of claim 1.

32. The method of claim 1, wherein said substrate is polysilicon carbide, said single-crystal film is silicon (111) and said epitaxial layer is GaN.

33. The method of claim 1, further including an AlN buffer layer between said single-crystal film and said epitaxial layer.

34. The method of claim 33, wherein said AlN buffer layer is between said single-crystal silicon (111) film and said epitaxial GAN layer.

35. The method of claim 1, wherein said substrate is poly-AlN, said single-crystal film is silicon (111) and said epitaxial layer is GaN.

36. The product of claim 13.

37. The product of claim 23.

* * * * *